United States Patent
Lai et al.

(10) Patent No.: US 11,270,093 B2
(45) Date of Patent: Mar. 8, 2022

(54) DISPLAY PANEL AND DISPLAY DEVICE

(71) Applicant: Xiamen Tianma Micro-Electronics Co., Ltd, Xiamen (CN)

(72) Inventors: Meng Lai, Xiamen (CN); Lifeng Lu, Xiamen (CN); Zhilong Zhuang, Xiamen (CN); Jiancai Huang, Xiamen (CN); Yumin Xu, Xiamen (CN); Xianyan Yang, Xiamen (CN)

(73) Assignee: XIAMEN TIANMA MICRO-ELECTRONICS CO., LTD, Xiamen (CN)

( * ) Notice: Subject to any disclaimer, the term of this patent is extended or adjusted under 35 U.S.C. 154(b) by 274 days.

(21) Appl. No.: 16/790,314

(22) Filed: Feb. 13, 2020

(65) Prior Publication Data
US 2021/0165989 A1     Jun. 3, 2021

(30) Foreign Application Priority Data
Nov. 29, 2019   (CN) .......................... 201911207079.4

(51) Int. Cl.
*G06K 9/00*     (2006.01)
*G06K 9/03*     (2006.01)
*H01L 27/146*     (2006.01)

(52) U.S. Cl.
CPC ............. *G06K 9/0004* (2013.01); *G06K 9/03* (2013.01); *H01L 27/14636* (2013.01); *H01L 27/14678* (2013.01)

(58) Field of Classification Search
CPC .. G06K 9/0004; G06K 9/03; H01L 27/14636; H01L 27/14678; H01L 27/14609; H01L 27/14601
See application file for complete search history.

(56) References Cited

U.S. PATENT DOCUMENTS

| | | | |
|---|---|---|---|
| 2017/0068835 A1* | 3/2017 | Kravets | ................ G06K 9/0002 |
| 2018/0039810 A1* | 2/2018 | Hwang | ................. H01L 23/528 |
| 2019/0212873 A1* | 7/2019 | Huang | .................. G06F 3/0418 |
| 2020/0175245 A1* | 6/2020 | Ding | ...................... H04N 5/378 |

FOREIGN PATENT DOCUMENTS

| | | |
|---|---|---|
| CN | 106557724 A | 4/2017 |
| CN | 108805066 A | 11/2018 |

\* cited by examiner

*Primary Examiner* — Abhishek Sarma
(74) *Attorney, Agent, or Firm* — Christensen O'Connor Johnson Kindness PLLC

(57) ABSTRACT

The present disclosure provides a display panel and a display device. The display panel includes a plurality of fingerprint recognition circuits. At least one of the plurality of fingerprint recognition circuits includes a light sense signal obtaining unit and a subtracted. The light sense signal obtaining unit is configured to obtain a first light sense voltage value and a second light sense voltage value, the first light sense voltage value is related to a first power voltage value, the second light sense voltage value is related to a second power voltage value, and the first power voltage value is greater than the second power voltage value. The subtracted is configured to subtract the second light sense voltage value from the first light sense voltage value to obtain a light sense data value.

18 Claims, 12 Drawing Sheets

DISPLAY PANEL AND DISPLAY DEVICE

CROSS-REFERENCE TO RELATED APPLICATIONS

The present application claims the benefit of priority to Chinese Patent Application No. 201911207079.4, filed on Nov. 29, 2019, the content of which is incorporated herein by reference in its entirety.

TECHNICAL FIELD

The present disclosure relates to the field of display technologies, and in particular, to a display panel and a display device.

BACKGROUND

In recent years, with rapid development of display technologies, more and more display devices have adopted fingerprint recognition to achieve user privacy protection. When a user operates a display device having a fingerprint recognition function, permission verification can be achieved by just touching a display screen with a finger, and the operation thereof is simple.

However, a potential (voltage) difference exists between a current-carrying conductor of an output signal of a fingerprint recognition circuit and a reference ground, that is, a common mode interference occurs. This will adversely affect an output result, thereby reducing an accuracy of fingerprint recognition.

SUMMARY

The present disclosure provides a display panel and a display device, which can reduce an adverse effect of the common mode interference on an output of a fingerprint recognition circuit, thereby increasing accuracy of fingerprint recognition.

In an aspect, an embodiment of the present discloses a display panel, including a plurality of fingerprint recognition circuits, at least one of the plurality of fingerprint recognition circuits including a light sense signal obtaining unit and a subtracted. The light sense signal obtaining unit is configured to obtain a first light sense voltage value and a second light sense voltage value, the first light sense voltage value is related to a first power voltage value, the second light sense voltage value is related to a second power voltage value, and the first power voltage value is greater than the second power voltage value; the subtracted is configured to subtract the second light sense voltage value from the first light sense voltage value to obtain a light sense data value.

In another aspect, an embodiment of the present discloses a display device including the display panel described above.

For the display panel and the display device in the embodiments of the present disclosure, the light sense signal obtaining unit generates a first light sense voltage value Vomit under driving of the first power voltage value V1, and generates a second light sense voltage value $V_{out2}$ under driving of the second power voltage value V2. By subtracting the second light sense voltage value $V_{out2}$ from the first light sense voltage value $V_{out1}$ by the subtracted 2, the common mode interference thereof can be eliminated to obtain the light sense data value without the common mode interference. Fingerprint recognition can be performed based on the light sense data value, which reduces an adverse effect of the common mode interference on output of the fingerprint recognition circuit, thereby increasing accuracy of fingerprint recognition.

BRIEF DESCRIPTION OF DRAWINGS

In order to more clearly illustrate technical solutions in embodiments of the present disclosure or in the related art, the accompanying drawings used in the embodiments and in the related art are introduced as follows. It should be noted that the drawings described as follows are merely part of the embodiments of the present disclosure, other drawings can also be obtained by those skilled in the art.

DESCRIPTION OF EMBODIMENTS

In order to make the purpose, technical solutions, and advantages of the embodiments of the present disclosure be understandable, the technical solutions in the embodiments of the present disclosure are described in the following with reference to the accompanying drawings. It should be understood that the described embodiments are merely exemplary embodiments of the present disclosure, which shall not be interpreted as providing limitations to the present disclosure. All other embodiments obtained by those skilled in the art according to the embodiments of the present disclosure are within the scope of the present disclosure.

The terms used in the embodiments of the present disclosure are merely for the purpose of describing particular embodiments but not intended to limit the present disclosure. Unless otherwise noted in the context, the singular form expressions "a", "an", "the" and "said" used in the embodiments and appended claims of the present disclosure are also intended to represent plural form expressions thereof.

Figure 1:
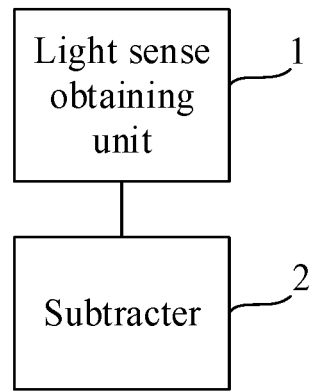
FIG. 1 is a block diagram of a structure of a fingerprint recognition circuit according to an embodiment of the present disclosure.

An embodiment of the present disclosure provides a display panel including a plurality of fingerprint recognition circuits. FIG. 1 is a block diagram of a structure of a fingerprint recognition circuit according to an embodiment of the present disclosure. As shown in FIG. 1, at least one fingerprint recognition circuit includes a light sense signal obtaining unit 1 and a subtracted 2. The light sense signal obtaining unit 1 is configured to obtain a first light sense voltage value $V_{out1}$ and a second light sense voltage value $V_{out2}$. The first light sense voltage value $V_{out1}$ is related to a first power voltage value V1, and the second light sense voltage value $V_{out2}$ is related to a second power voltage value V2. The first power voltage value V1 is larger than the second power voltage value V2. The subtracted 2 is configured to subtract the second light sense voltage value $V_{out2}$ from the first light sense voltage value $V_{out1}$ to obtain a light sense data value.

The light sense signal obtaining unit 1 is configured to generate a light sense voltage value corresponding to an illumination intensity under an action of illumination. Here, a power voltage is used to drive the light sense signal obtaining unit 1 to operate, so that the first light sense voltage value $V_{out1}$ is generated under driving of the first power voltage value V1, and the second light sense voltage value $V_{out2}$ is generated under driving of the second power voltage value V2. The two light sense voltage values generated by a same light sense signal obtaining unit 1 under different power voltage values can be equivalently obtained under a same illumination intensity. Therefore, it can be understood that the two light sense voltage values correspond to a same common mode interference. By subtracting the second light sense voltage value $V_{out2}$ from the first light sense voltage value $V_{out1}$ by the subtracted 2, the common mode interference can be eliminated to obtain a light sense data value without common mode interference. Fingerprint recognition can be performed based on the light sense data value. The display panel has a fingerprint recognition area. The fingerprint recognition area may be an entire display area to achieve fingerprint recognition in the entire display area, or the fingerprint recognition area may also be a specific area in the display area to achieve fingerprint recognition in the specific area. A plurality of fingerprint recognition circuits is provided in the fingerprint recognition area. Each fingerprint recognition circuit is configured to obtain the light sense data value at a position thereof, and it can be determined whether the fingerprint at the position is a valley or a ridge based on the light sense data value. The fingerprint recognition function is achieved in the entire fingerprint recognition area based on the light sense data values at a plurality of positions.

The common mode interference means that an interference voltage has a same amplitude on a signal line and its return line (commonly called a signal ground line). For example, an interference voltage in an output signal of the fingerprint recognition circuit and an interference voltage in a reference ground have a same amplitude. Since the common mode interference is applied to the entire circuit system, different circuits or circuits that operate at different moments have a same common mode interference. Therefore, in this embodiment of the present disclosure, two different light sense voltage values have a same or similar common mode interference voltage. By subtracting one of the two different light sense voltage values from the other one, the common mode interference can be eliminated or reduced.

For the display panel in this embodiment of the present disclosure, the light sense signal obtaining unit generates a first light sense voltage value $V_{out1}$ under driving of (i.e., when being driven by) the first power voltage value V1, and generates a second light sense voltage value $V_{out2}$ under driving of (i.e., when being driven by) the second power voltage value V2. When the subtracted 2 subtracts the second light sense voltage value $V_{out2}$ from the first light sense voltage value $V_{out1}$, the common mode interference thereof can be eliminated to obtain the light sense data value without the common mode interference. Fingerprint recognition can be performed based on the light sense data value, which reduces an adverse effect of the common mode interference on an output of the fingerprint recognition circuit, thereby increasing accuracy of fingerprint recognition.

Figure 2:
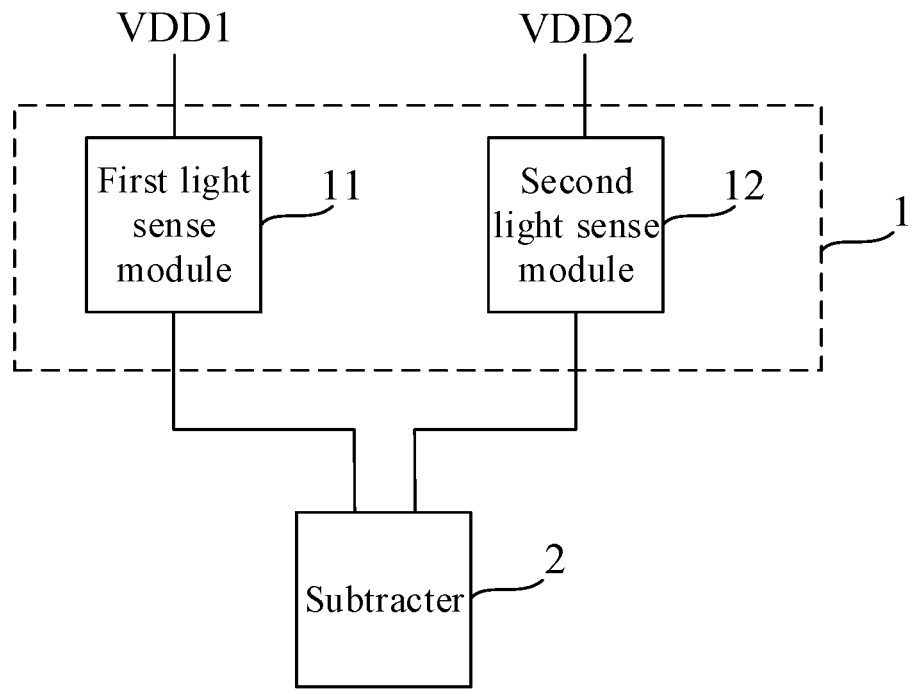
FIG. 2 is a block diagram of a structure of another fingerprint recognition circuit according to an embodiment of the present disclosure.

FIG. 2 is a block diagram of a structure of another fingerprint recognition circuit according to an embodiment of the present disclosure. In an example, as shown in FIG. 2, the light sense signal obtaining unit 1 includes a first light sense module 11 and a second light sense module 12. The first light sense module 11 includes a power terminal electrically connected to a first power voltage terminal VDD1 that is configured to provide a first power voltage value V1, and a light sense output terminal electrically connected to a first light sense output terminal out1 that is configured to output a first light sense voltage value $V_{out1}$. The second light sense module 12 includes a power terminal electrically connected to a second power voltage terminal VDD2 that is configured to provide a second power voltage value V2, and light sense output terminal electrically connected to a second light sense output terminal out2 that is configured to output a second light sense voltage value $V_{out2}$.

In the structure shown in FIG. 2, the same fingerprint recognition circuit generates corresponding light sense voltage values through two light sense modules that operate under different driving voltages respectively. Since the first light sense module 11 and the second light sense module 12 belong to the same fingerprint recognition circuit and are close to each other, the first light sense module 11 and the second light sense module 12 receive same illumination and then generate the light sense voltage values under different power voltage values at the same position. Then, the subtracted 12 subtracts the second light sense voltage value $V_{out2}$ outputted from the second light sense module 12 from the first light sense voltage value $V_{out1}$ outputted from the first light sense module 11 to obtain the light sense data value. The first light sense module 11 and the second light sense module 12 can generate the corresponding first light sense voltage value $V_{out1}$ and second light sense voltage value $V_{out2}$ at the same time, which can reduce operation time of each fingerprint recognition circuit, thereby increasing a scanning frequency of the fingerprint recognition circuit in the entire fingerprint recognition area. In this way, an efficiency of fingerprint recognition can be increased.

Figure 3:
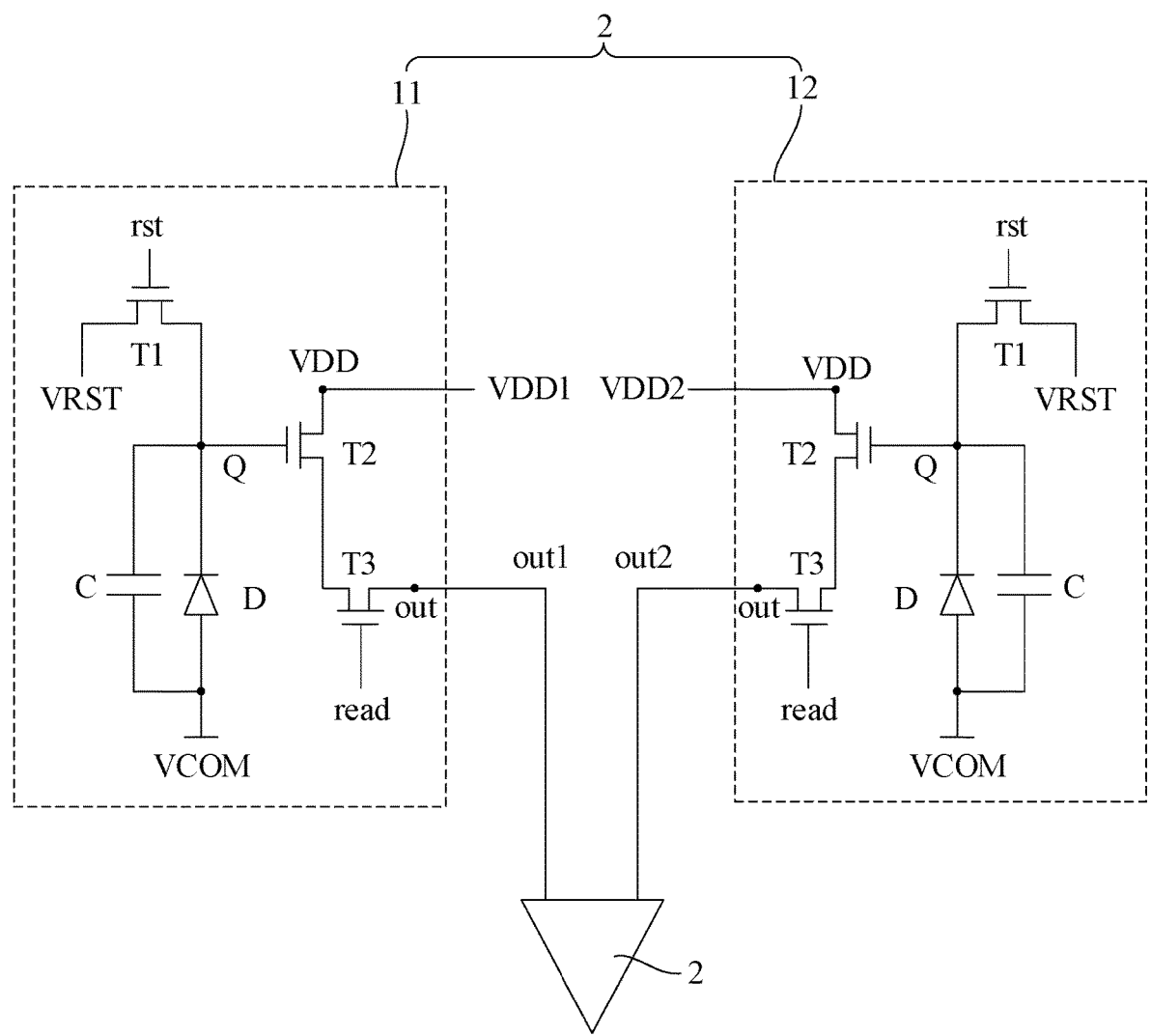
FIG. 3 is a schematic diagram of a specific circuit structure of the fingerprint recognition circuit shown in FIG. 2.

FIG. 3 is a schematic diagram of a specific circuit structure of the fingerprint recognition circuit shown in FIG.

Figure 4:
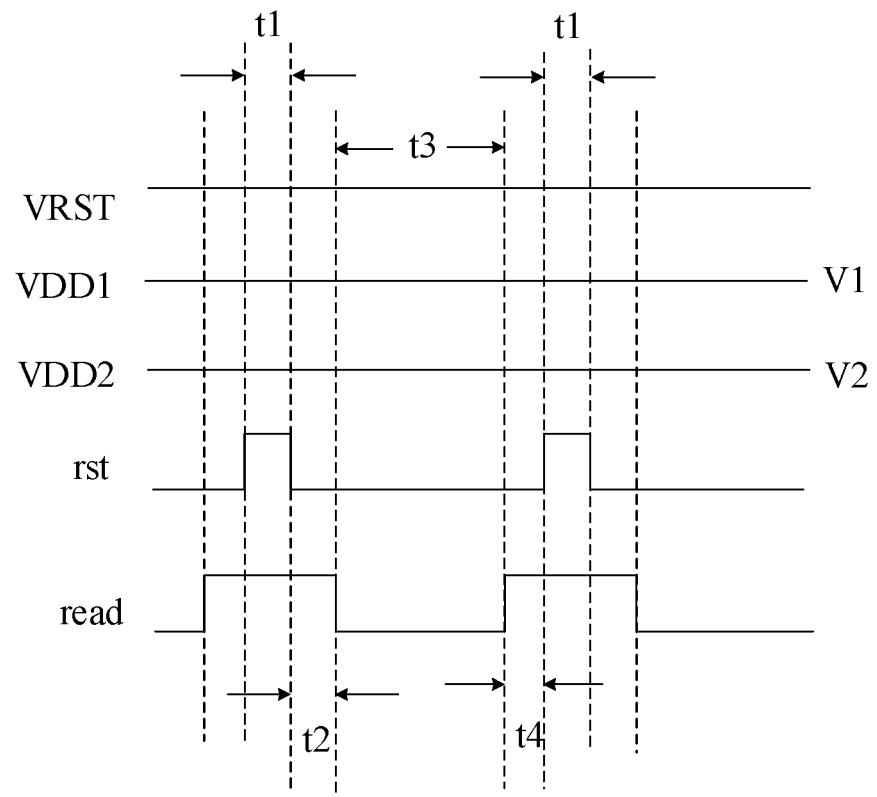
FIG. 4 is a signal time sequence diagram of the fingerprint recognition circuit shown in FIG. 3.

2. FIG. 4 is a signal time sequence diagram of the fingerprint recognition circuit shown in FIG. 3. In an example, as shown in FIG. 3 and FIG. 4, each of the first light sense module 11 and the second light sense module 12 includes: a first transistor T1 including a first terminal electrically connected to a reset voltage terminal VRST, a second terminal electrically connected to a light sense change node Q, and a control terminal electrically connected to a reset control terminal rst; a second transistor T2 including a first terminal electrically connected to the power terminal VDD, a second terminal, and a control terminal electrically connected to the light sense change node Q; a third transistor T3 including a first terminal electrically connected to the second terminal of the second transistor T2, a second terminal electrically connected to the light sense output terminal out, and a control terminal electrically connected to a reading control terminal read; a photodiode D including a first terminal electrically connected to the light sense change node Q, and a second terminal electrically connected to a reference voltage terminal VCOM; and a capacitor C including a first terminal electrically connected to the light sense change node Q and a second terminal electrically connected to the reference voltage terminal VCOM.

For example, an operation process of any one of the first light sense module 11 and the second light sense module 12 shown in FIG. 3 may sequentially include a reset period t1, a first reading period t2, an exposure period t3, and a second reading period t4. During the reset period t1, a turned-on level provided by the reset control terminal rst controls the first transistor T1 to be turned on, and a reset voltage of the reset voltage terminal VRST is transmitted to the light sense change node Q through the first transistor T1, so as to reset a potential of the light sense change node Q. During the first reading period t2, the exposure period t3, and the second reading period t4, the first transistor T1 is turned off, the photodiode D generates a leakage current due to exposure to illumination, the capacitor C is discharged, and the potential of the light sense change node Q gradually decreases. The second transistor T2 operates in a linear zone, and a magnitude of its leakage current is proportional to the potential of the light sense change node Q. During the first reading period t2 and the second reading period t4, the third transistor T3 is controlled to be turned on, the voltage of the power terminal VDD and a turned-on degree of the second transistor T2 determine the potential of the light sense output terminal out, and the turned-on degree of the second transistor T2 is determined by the voltage of the light sense change node Q, that is, the potential of the light sense change node Q determines the potential of the light sense output terminal out. The first light sense module 11 and the second light sense module 12 operate simultaneously, that is, they include a same reset period t1 first reading period t2, exposure period t3, and second reading period t4. The first light sense module 11 outputs a first light sense voltage value $V_{out1}$ from the light sense output terminal out during the first reading period t2. The second light sense module 12 outputs a second light sense voltage value $V_{out2}$ from the light sense output terminal out during the first reading period t2. The second light sense voltage value $V_{out2}$ is subtracted from the first light sense voltage value $V_{out1}$ by the subtracted 2, so as to obtain a light sense data value Va. The first light sense module 11 outputs a first light sense voltage value $V_{out1}$' from the light sense output terminal out during the second reading period t4. The second light sense module 12 outputs a second light sense voltage value $V_{out2}$' from the light sense output terminal out during the second reading period t4, and the second light sense voltage value $V_{out2}$' is subtracted from the first light sense voltage value $V_{out1}$' by the subtracted 2, so as to obtain a light sense data value Vb. Here, (Va-Vb) can indicate an illumination intensity of the fingerprint recognition circuit during the exposure period t3. It should be noted that, in this embodiment of the present disclosure, the circuit structure is described by taking an n-type transistor as an example, and in the corresponding signal time sequence, a high level is a turned-on level and a low level is a turned-off level. However, type of each transistor is not limited by the embodiments of the present disclosure. When the transistor is a p-type transistor, correspondingly, a low level is a turned-on level and a high level is a turned-off level. Moreover, a direction of the photodiode D is not limited. For example, in the structure shown in FIG. 3, the first terminal of the photodiode D is a cathode and the second terminal of the photodiode D is an anode, and in other implementation manners, it is also possible that the first terminal of the photodiode D is an anode and the second terminal of the photodiode D is a cathode. These different options are not to be limited by the illustrated embodiments of the present disclosure.

Figure 5:
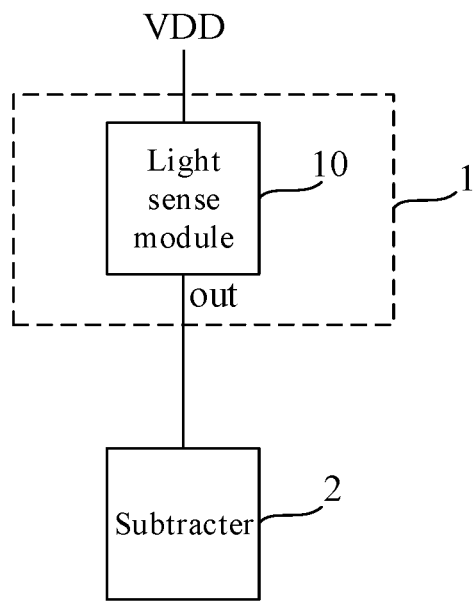
FIG. 5 is a block diagram of a structure of another fingerprint recognition circuit according to an embodiment of the present disclosure.

FIG. 5 is a block diagram of a structure of another fingerprint recognition circuit according to an embodiment of the present disclosure. In an example, as shown in FIG. 5, the light sense signal obtaining unit 1 includes a light sense module 10. The light sense module 10 operates in a plurality of fingerprint recognition cycles, and each fingerprint recognition cycle includes a first phase ta and a second phase tb. During the first phase ta, the power terminal VDD of the light sense module 10 provides the first power voltage value V1, and the light sense output terminal out outputs the first light sense voltage value $V_{out1}$. During the second phase tb, the power terminal VDD of the light sensor module 10 provides the second power terminal voltage value V2, and the light sense output terminal out outputs the second light sense voltage value $V_{out2}$.

In the structure shown in FIG. 5, the fingerprint recognition circuit includes only one light sense module 10, and the light sense module 10 performs two generation processes of the light sense voltage value in a same fingerprint recognition cycle, and the two generation processes of the light sense voltage value are based on different power voltage values. Since the two generation processes of the light sense voltage value are close to each other, it can be equivalent to receiving same illumination and generating the light sense voltage values under different power voltage values at the same position. Then, one of the two light sense voltage values outputted from a same light sense module 10 during different phases is subtracted from the other one, so as to obtain the light sense data value. Thus, the common mode interference is eliminated by a time-division multiplexing manner, and only one light sense module is required in a same fingerprint recognition circuit. In this way, the fingerprint recognition circuit has a simpler structure and occupies a smaller space.

Figure 6:
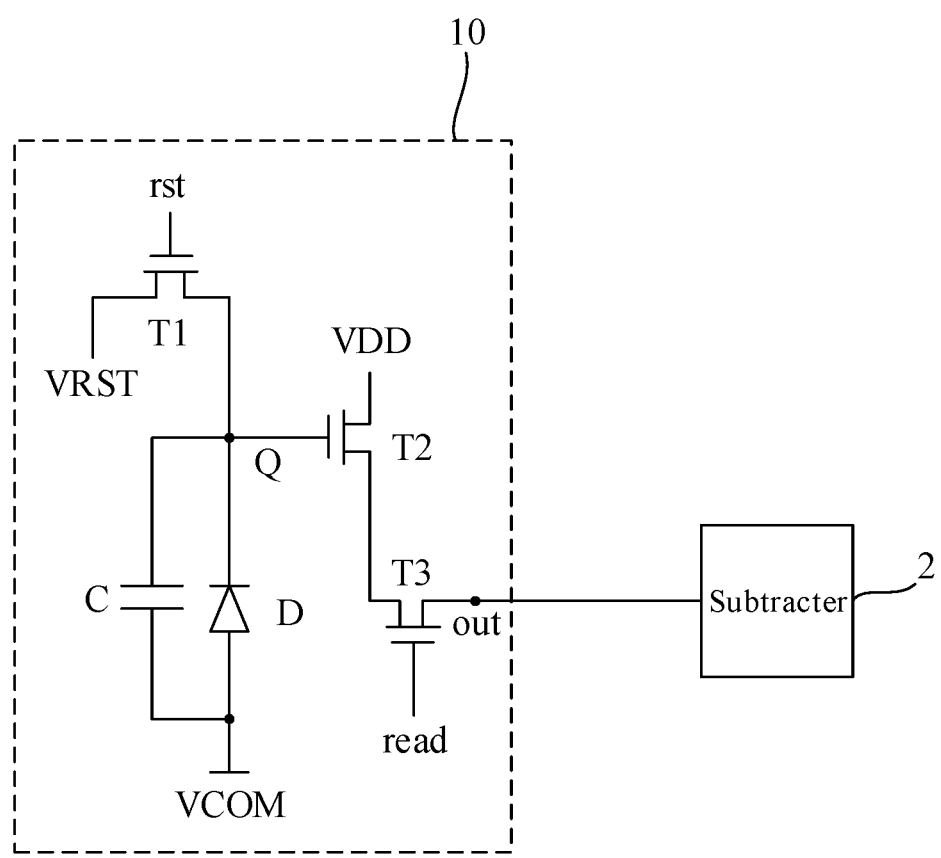
FIG. 6 is a schematic diagram of a specific circuit structure of the fingerprint recognition circuit shown in FIG. 5.
Figure 7:
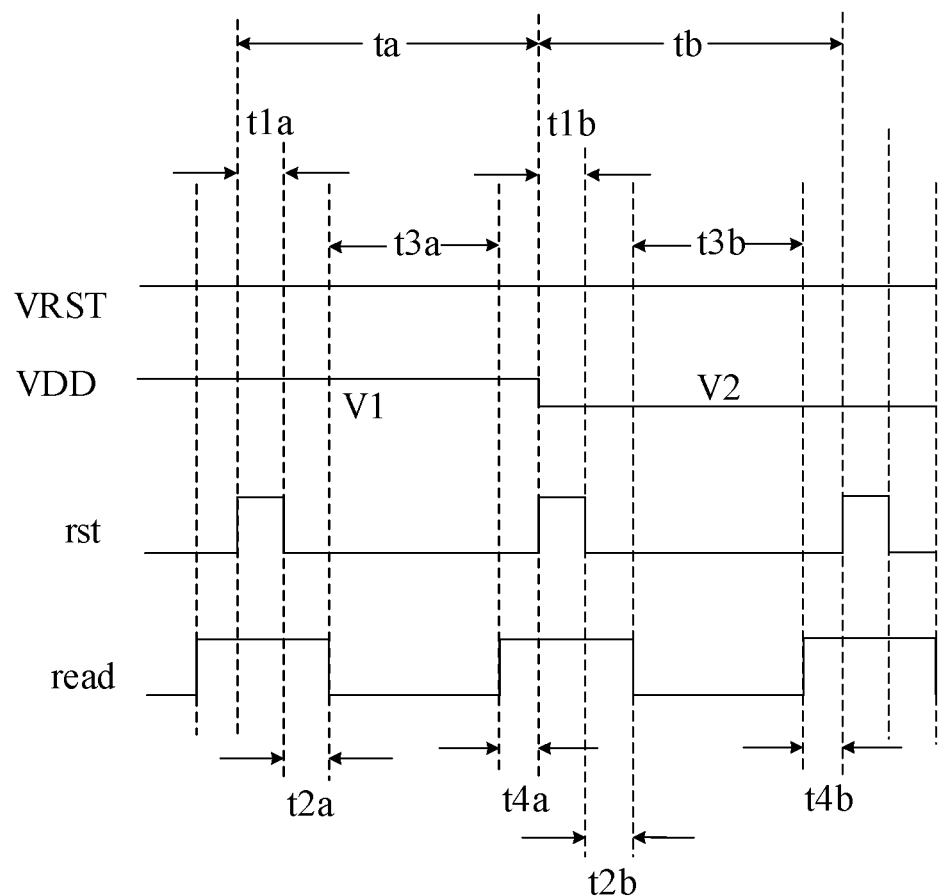
FIG. 7 is a signal time sequence diagram of the fingerprint recognition circuit shown in FIG. 6.

FIG. 6 is a schematic diagram of a specific circuit structure of the fingerprint recognition circuit shown in FIG. 5. FIG. 7 is a signal time sequence diagram of the fingerprint recognition circuit shown in FIG. 6. In an example, as shown in FIG. 6 and FIG. 7, the light sense module 10 includes: a first transistor T1 including a first terminal electrically connected to a reset voltage terminal VRST, a second terminal electrically connected to a light sense change node Q, and a control terminal electrically connected to a reset control terminal rst; a second transistor T2 including a first terminal electrically connected to a power terminal VDD, a second terminal, and a control terminal electrically connected to the light sense change node Q; a third transistor T3 including a first terminal electrically connected to the second terminal of the second transistor T2, a second terminal electrically connected to a light sense output terminal out, and a control terminal electrically connected to a reading control terminal read; a photodiode D including a first terminal electrically connected to the light sense change node Q, and a second terminal electrically connected to a reference voltage terminal VCOM; and a capacitor C including a first terminal electrically connected to the light sense change node Q, and a second terminal electrically connected to the reference voltage terminal VCOM.

In an example, the operation process of the light sense module 10 shown in FIG. 6 includes a plurality of fingerprint recognition cycles, and each fingerprint recognition cycle includes a first phase ta and a second phase tb. The first phase ta includes a reset period t1a, a first reading period t2a, an exposure period t3a, and a second reading period t4a. During the reset period t1a, the turned-on level provided by the reset control terminal rst controls the first transistor T1 to be turned on, and the reset voltage of the reset voltage terminal VRST is transmitted to the light sense change node Q through the first transistor T1, so as to reset the potential of the light sense change node Q. During the first reading period t2a, the exposure period t3a, and the second reading period t4a, the first transistor T1 is turned off, the photodiode D generates a leakage current due to exposure to illumination, the capacitor C is discharged, the potential of the light sense change node Q gradually decreases, the second transistor T2 operates in the linear zone, and a magnitude of its leakage current is proportional to the potential of the light sense change node Q. During the first reading period t2a and the second reading period t4a, the third transistor T3 is controlled to be turned on, and the voltage of the power terminal VDD is the first power voltage value V1. During the first reading period t2a, the light sense output terminal out outputs the first light sense voltage value $V_{out1}$. During the second reading period t4a, the light sense output terminal out outputs the first light sense voltage value $V_{out1}'$. During the second phase tb and the first phase ta, except for change of the power terminal VDD, the other control processes maintain the same. The second phase tb includes a reset period t1b, a first reading period t2b, an exposure period t3b, and a second reading period t4b. During the reset period t1b, a turned-on level provided by the reset control terminal rst controls the first transistor T1 to be turned on, and the reset voltage of the reset voltage terminal VRST is transmitted to the light sense change node Q through the first transistor T1, so as to reset the potential of the light sense change node Q. During the first reading period t2b, the exposure period t3b, and the second reading period t4b, the first transistor T1 is turned off, the photodiode D generates a leakage current due to illumination, the capacitor C is discharged, the potential of the sense change node Q gradually decreases, the second transistor T2 operates in a linear zone, and a magnitude of its leakage current is proportional to the potential of the light sense change node Q. During the first reading period t2b and the second reading period t4b, the third transistor T3 is controlled to be turned on, the voltage of the power terminal VDD is the second power voltage value V2. During the first reading period t2b, the light sense output terminal out outputs the second light sense voltage value $V_{out2}$. During the second reading period t4b, the light sense output terminal out outputs the second light sense voltage value $V_{out2}'$. The second light sense voltage value $V_{out2}$ is subtracted from the first light sense voltage value $V_{out1}$ by the subtracted 2 to obtain the light sense data value Va, and the second light sense voltage value $V_{out2}'$ is subtracted from the first light sense voltage value $V_{out1}'$ by the subtracted to obtain the light sense data value Vb. (Va-Vb) can indicate an illumination intensity of the fingerprint recognition circuit.

Figure 8:
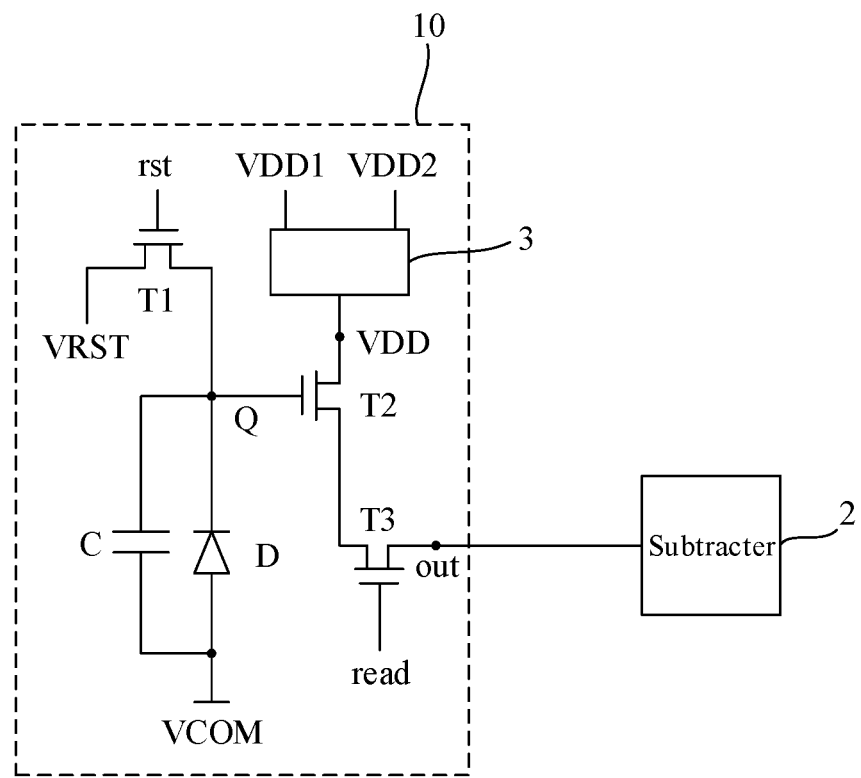
FIG. 8 is a schematic diagram of another specific circuit structure of the fingerprint recognition circuit shown in FIG. 6.

FIG. 8 is a schematic diagram of another specific circuit structure of the fingerprint recognition circuit shown in FIG. 6. In an example, as shown in FIG. 8 and FIG. 7, the light sense module 10 further includes: a gating module 3, which is electrically connected to the first power voltage terminal VDD1, the second power voltage terminal VDD2 and the power terminal VDD. The first power voltage terminal VDD1 is configured to provide the first power voltage value V1, and the second power voltage terminal VDD2 is configured to provide the second power voltage value V2. During the first phase ta, the gating module 3 allows the first power voltage terminal VDD1 to be electrically connected to the power terminal VDD, and at this time the second power voltage terminal VDD2 is not electrically connected to the power terminal VDD, so that during the first phase ta, the first power voltage terminal VDD1 provides the first power voltage value V1 to the power terminal VDD. During the second phase tb, the gating module 3 allows the second power voltage terminal VDD2 to be electrically connected to the power terminal VDD, and at this time the first power voltage terminal VDD1 is not electrically connected to the power terminal VDD, so that during the second phase tb, the second power voltage terminal VDD2 provides the second power voltage value V2 to the power terminal VDD.

The operation process, principle and signal time sequence of the structure shown in FIG. 8 are the same as those of the structure shown in FIG. 6, and a changeable power voltage is provided to the power terminal VDD through the gating module 3 and two power voltage terminals. The display panel needs to be provided with a plurality of light sense signal obtaining units 1 arranged in an array. For each light sense signal obtaining unit 1, light sense recognition can be achieved by row-by-row scanning by the plurality of light sense signal obtaining units 1. Therefore, the light sense signal obtaining units 1 in different rows have different signal time sequences at the power terminals VDD. When the structure shown in FIG. 8 is used, a driving chip only needs to respectively provide a constant potential to the first power voltage terminal VDD1 and the second power voltage terminal VDD2, without separately providing a changeable voltage to the corresponding power terminals VDD of the light sense signal obtaining units 1 in different rows. In this way, cooperating with time sequence control of the gating module 3, the light sense signal obtaining units 1 can normally operate during the row-by-row scanning process. Moreover, the power voltage is generally larger in amplitude than the control voltage. If a changeable power voltage is directly provided by the driving chip, power consumption and cost may increase. Therefore, the structure shown in FIG. 8 can reduce the power consumption and cost of the driving chip.

Figure 9:
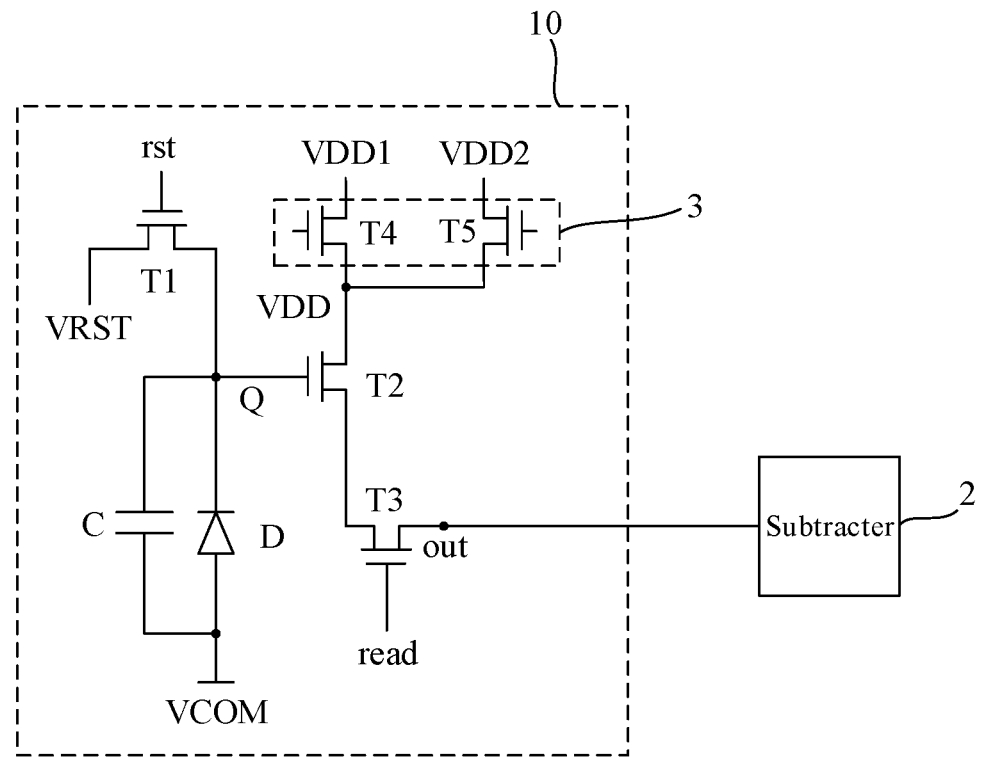
FIG. 9 is a schematic diagram of a specific circuit structure of the fingerprint recognition circuit shown in FIG. 8.

FIG. 9 is a schematic diagram of a specific circuit structure of the fingerprint recognition circuit shown in FIG. 8. In an example, as shown in FIG. 9 and FIG. 7, the gating module 3 includes: a fourth transistor T4 including a first terminal electrically connected to the first power voltage terminal VDD1, and a second terminal electrically connected to the power terminal VDD; and a fifth transistor T5 including a first terminal electrically connected to the second power voltage terminal VDD2, and a second terminal electrically connected to the power terminal VDD. During the first phase ta, the fourth transistor T4 is turned on, the fifth transistor T5 is turned off, and the first power voltage value V1 provided by the first power voltage terminal VDD1 is transmitted to the power terminal VDD through the fourth transistor T4. During the second phase tb, the fifth transistor T5 is turned on, the fourth transistor T4 is turned off, and the second power voltage value V2 provided by the second power voltage terminal VDD2 is transmitted to the power terminal VDD through the fifth transistor T5.

In an example, as shown in FIGS. 1 to 9, the above-mentioned first power voltage value is V1 and the second power voltage value is V2, where V1>0 and V2>0. When the two power voltage values are positive, the corresponding two light sense voltage values are also positive. Design of the circuit and analysis of the calculation logic thereof are simpler and the design cost is lower. For example, in the structure as shown in FIG. 6 to FIG. 9, the subtracted 2 needs to perform voltage sampling from the same node at different time periods so as to obtain two light sense voltage values for further calculation. If the two values are positive values, the corresponding voltage sampling circuit only needs to be designed according to a logic of positive voltage value sampling. However, if there are a positive value and a negative value, two cases need to be considered to design the sampling circuit so as to achieve normal operation of the circuit.

In an example, V1>2*V2. For example, the first power voltage value is 10V and the second power voltage value is 5V. In this way, a difference between the two light sense voltage values generated based on the two power voltage values is relatively large, thereby increasing sensitivity of light detection.

In an example, the first power voltage value is V1, and the second power voltage value is V2, where V1>0 and V2<0. When the first power voltage value V1 and the second power voltage value V2 are voltages with different polarities, after one of the two light sense voltage value generated based on the two power voltage values is subtracted from the other one, the amplitude of the obtained light sense data value is larger, and the common mode interference can be eliminated. That is, the sensitivity of light detection can be increased while eliminating the common mode interference.

In an example, V1=−V2. When the first power voltage value and the second power voltage value are voltage values with the same amplitude and opposite polarities, in an ideal case, the two light sense voltage values obtained based on the two power voltage values are also voltage values with the same amplitude and opposite polarities. In this case, after one voltage is subtracted from the other one, a signal that doubles the amplitude of the original light sense voltage value is obtained. In this way, the sensitivity of light detection can be doubled. Moreover, since the two power voltage values have the same amplitude, the two light sense voltage values have the same amplitude, that is, the corresponding values during the circuit operation are the same to each other. Therefore, only a polarity difference needs to be considered, and the circuit design is relatively simple.

Figure 10:
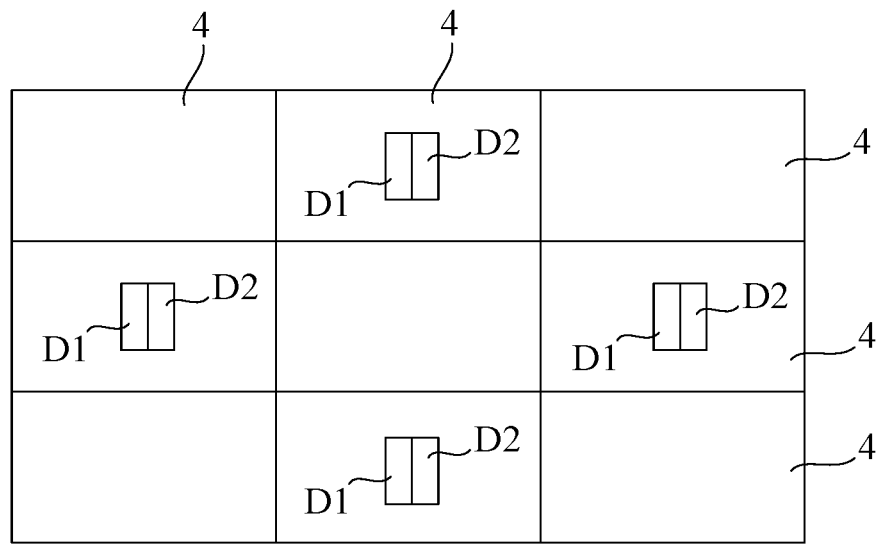
FIG. 10 is a schematic diagram of a structure of a partial area of a display panel according to an embodiment of the present disclosure.

FIG. 10 is a schematic diagram of a structure of a partial area of a display panel according to an embodiment of the present disclosure. In an example, as shown in FIG. 3 and FIG. 10, the display panel includes a plurality of pixels 4. The photodiode D in the first light sense module 11 is a first photodiode D1, and the photodiode D in the second light sense module 12 is a second photodiode D2. The first photodiode D1 and the second photodiode D2 in a same fingerprint recognition circuit are located in an area defined by a same pixel 4. For example, one pixel 4 may include a red sub-pixel, a green sub-pixel, and a blue sub-pixel to achieve color display. The fingerprint recognition circuits are distributed in the display area to implement the fingerprint recognition function in the display area. A distribution density of the fingerprint recognition circuits can be designed as required. For example, one fingerprint recognition circuit is provided for each two pixels, or one fingerprint recognition circuit is provided for each one pixel. The photodiodes of two light sense modules in the same fingerprint recognition circuit are arranged in an area defined by a same pixel 4, so as to achieve a small difference in the illumination intensity obtained by the two, thereby increasing accuracy of fingerprint recognition. The area defined by the pixel 4 refers to an area defined by a pixel driving circuit for driving the pixel, rather than an area defined by an opening of the pixel 4 for emitting light. Moreover, it should be noted that the embodiments of the present disclosure are described merely by taking one pixel including red, green, and blue sub-pixels as an example, but the pixel structure will not be limited by these example embodiments. For example, one pixel may include a red sub-pixel, a green sub-pixel, a blue sub-pixel, and a white sub-pixel, and the white sub-pixel may be used to increase brightness.

Figure 11:
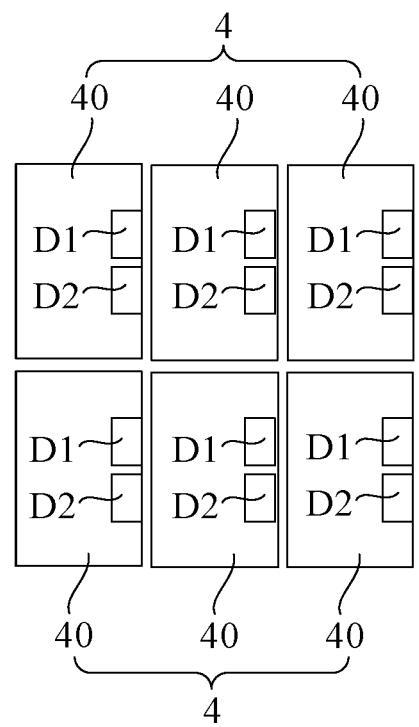
FIG. 11 is a schematic diagram of a structure of a partial area of a display panel according to an embodiment of the present disclosure.

FIG. 11 is a schematic diagram of a structure of a partial area of a display panel according to an embodiment of the present disclosure. In an example, as shown in FIG. 3 and FIG. 11, each pixel 4 includes a plurality of sub-pixels 40. For example, one pixel 4 includes one red sub-pixel 40, one green sub-pixel 40, and one blue sub-pixel 40. The first photodiode D1 and the second photodiode D2 in a same fingerprint recognition circuit are located in an area defined by a same sub-pixel 40. The two photodiodes in the same fingerprint recognition circuit can be closer to each other, thereby further reducing the difference in illumination intensity obtained by the two photodiodes, and thus further increasing the accuracy of fingerprint recognition.

Figure 12:
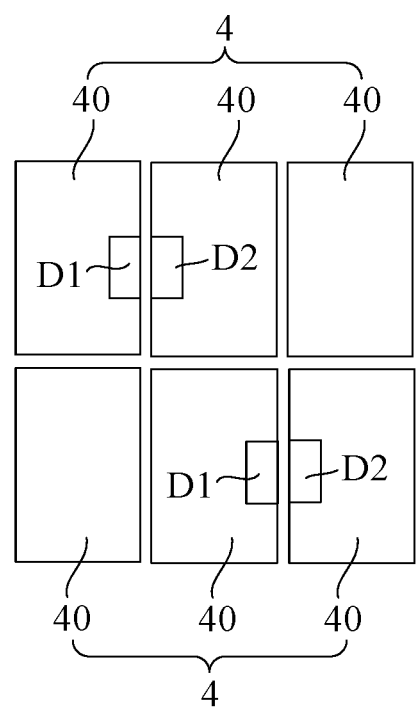
FIG. 12 is a schematic diagram of a structure of a partial area of a display panel according to an embodiment of the present disclosure.

FIG. 12 is a schematic diagram of a structure of a partial area of a display panel according to an embodiment of the present disclosure. In an example, as shown in FIG. 3 and FIG. 12, each pixel 4 includes a plurality of sub-pixels 40. The first photodiode D1 and the second photodiode D2 in a same fingerprint recognition circuit are located at a junction between two adjacent sub-pixels 40. The two photodiodes in the same fingerprint recognition circuit are located at the junction between two adjacent sub-pixels 40, so that the two photodiodes can be closer to reduce the difference in illumination intensity obtained by the two, thereby increasing the accuracy of fingerprint recognition. Moreover, the photodiode is far from a center of the sub-pixel 40, thereby reducing an adverse effect of the photodiode on display.

Figure 13:
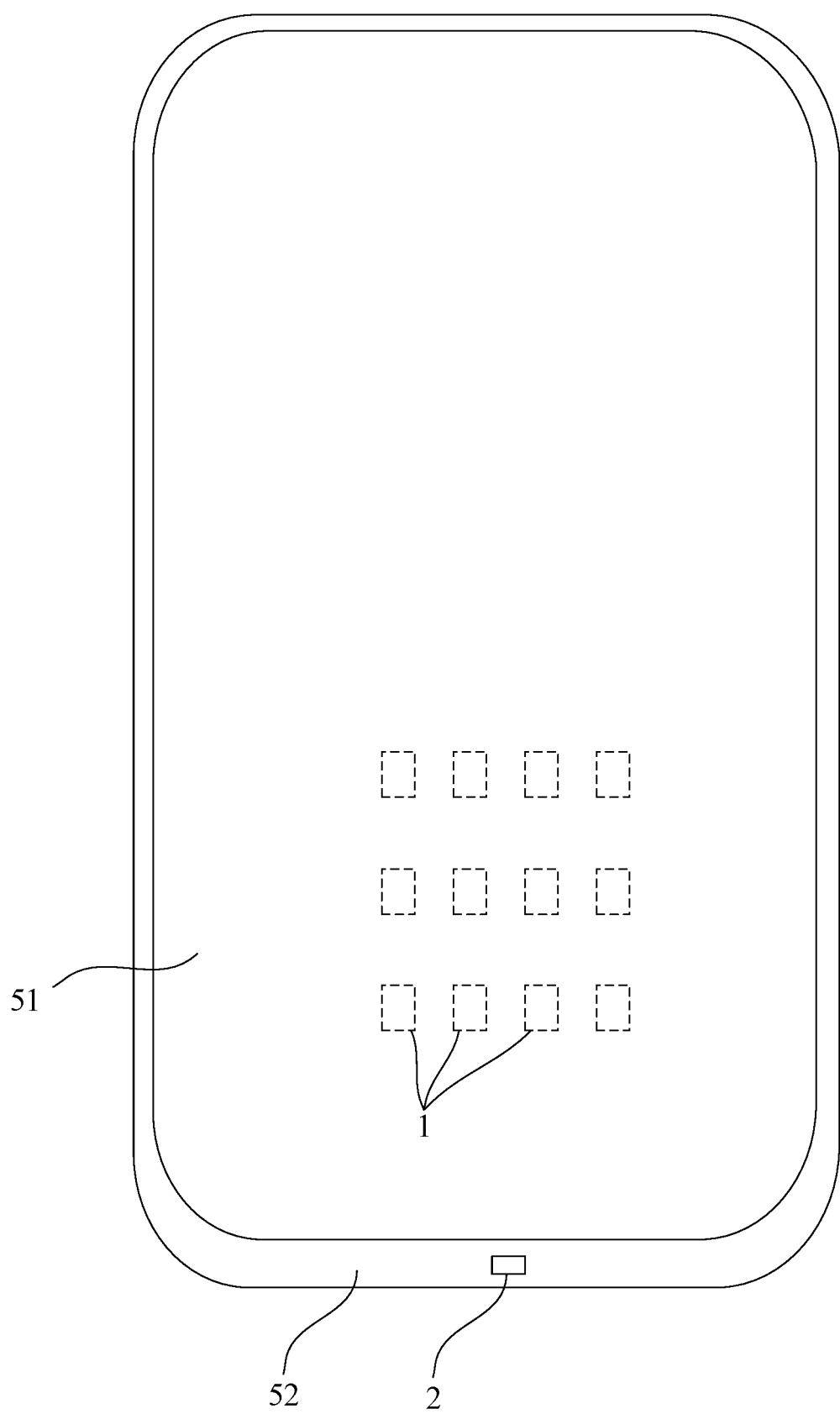
FIG. 13 is a schematic diagram of a structure of a display panel according to an embodiment of the present disclosure.

FIG. 13 is a schematic diagram of a structure of a display panel according to an embodiment of the present disclosure. In an example, as shown in FIG. 1 to FIG. 13, the subtracted 2 is located in the non-display area 52. A plurality of light sense signal obtaining units 1 may be distributed in a matrix so as to obtain a data value of the light sense signal at each position in the fingerprint recognition area. In order to reduce a space that occupies the display area 51, the subtracted 2 may be provided in the non-display area 52. Moreover, it should be noted that in this embodiment of the present disclosure, different fingerprint recognition circuits can be independent from each other, that is, each fingerprint recognition circuit includes a light sense signal obtaining unit 1 and a subtracted 2 that are independent from each other. In other implementations, since a function of the subtracted 2 is logical calculation, a same logic circuit for example can be used as a subtracted for a plurality of fingerprint recognition circuits, that is, the plurality of fingerprint recognition circuits share a same subtracted 2.

Figure 14:
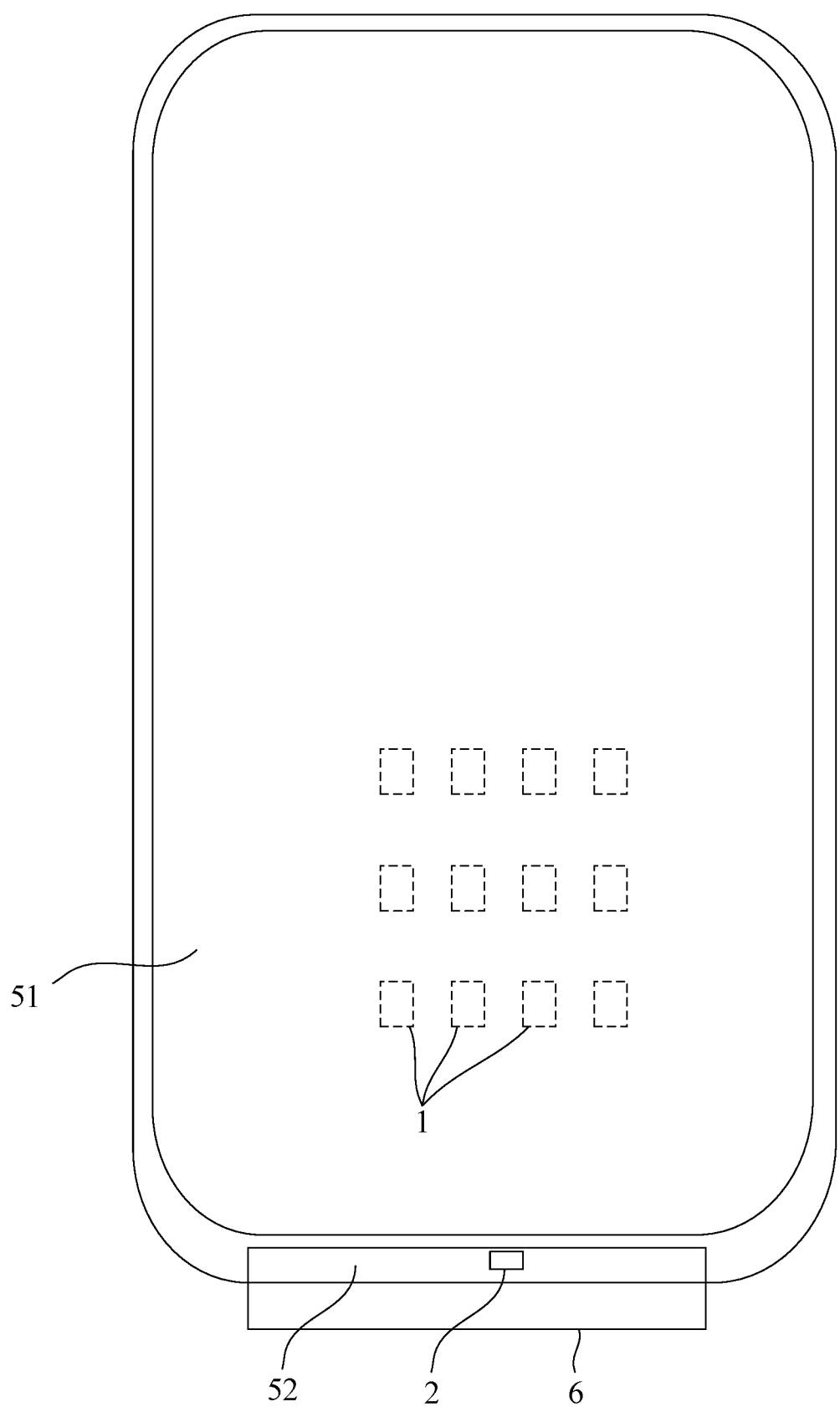
FIG. 14 is a schematic diagram of a structure of a display panel according to an embodiment of the present disclosure.

FIG. 14 is a schematic diagram of a structure of a display panel according to an embodiment of the present disclosure. In an example, as shown in FIG. 1 to FIG. 14, the display panel further includes a flexible circuit board 6 located in the non-display area 52, and the subtracted 2 is located on the flexible circuit board 6. The flexible circuit board 6 is configured to achieve communication connection between a main body of the display panel and a main board. For example, the main body of the display panel is bound and connected to a first flexible circuit board, and the first flexible circuit board is bound to the driving chip. The first flexible circuit board is configured to achieve electrical connection between the driving chip and the main body of the display panel. The first flexible circuit board is further bound and connected to a second flexible circuit board, and the second flexible circuit board is bound and connected to the main board. The second flexible circuit board is configured to achieve electrical connection between the main board and the driving chip. In this embodiment of the present disclosure, the subtracted 2 may be located on the first flexible circuit board or the second flexible circuit board. The subtracted 2 being located on the flexible circuit board 6 can also reduce the space that occupies the display area 51.

Figure 15:
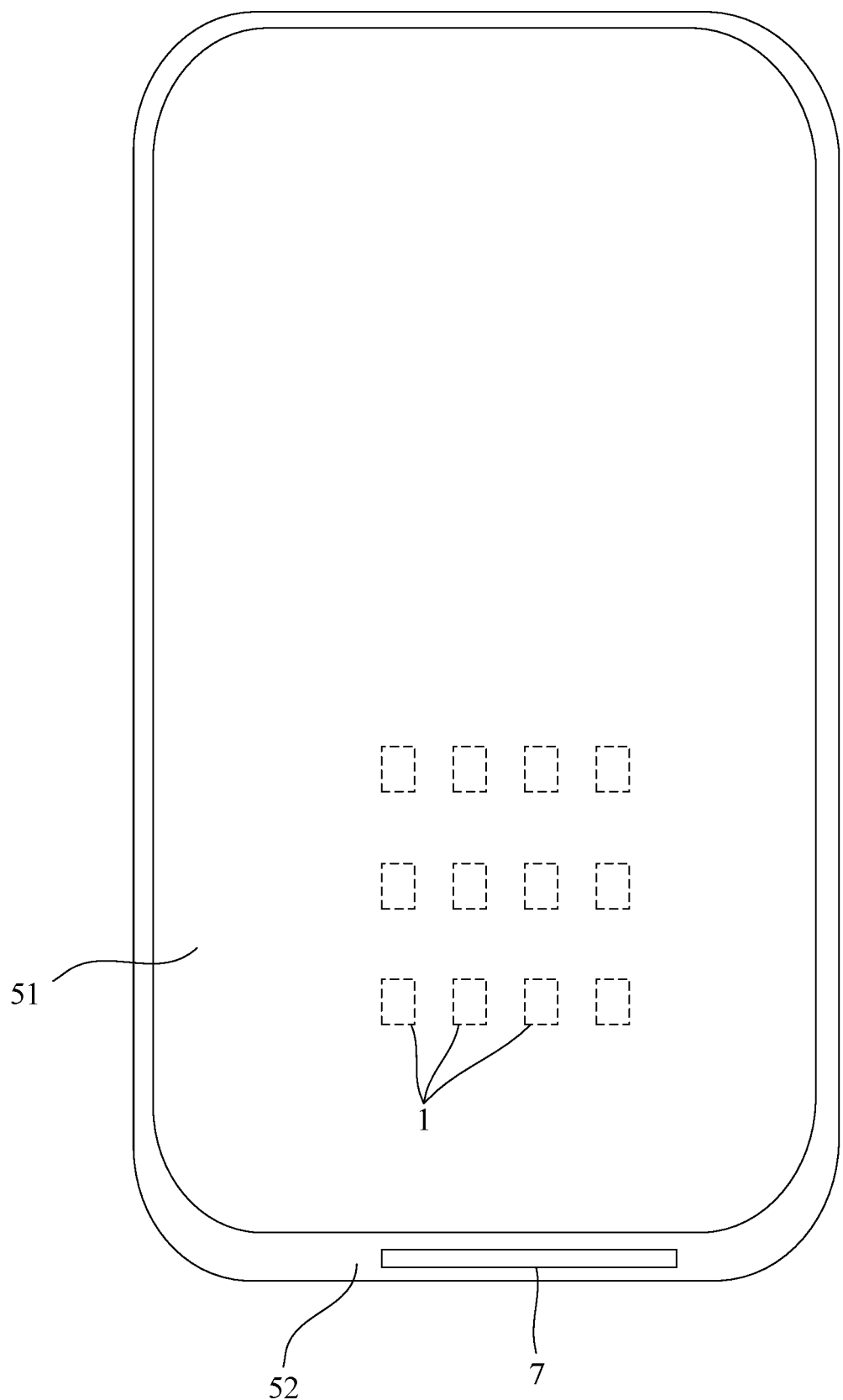
FIG. 15 is a schematic diagram of a structure of a display panel according to an embodiment of the present disclosure.

FIG. 15 is a schematic diagram of a structure of a display panel according to an embodiment of the present disclosure. In an example, as shown in FIGS. 1 to 15, the display panel further includes a driving chip 7 located in the non-display area 52, and the subtracted 2 is integrated in the driving chip 7. In this way, the space that occupies the display area 51 can be reduced. The driving chip 7 can also be used to drive the display panel to achieve a function of image display.

Figure 16:
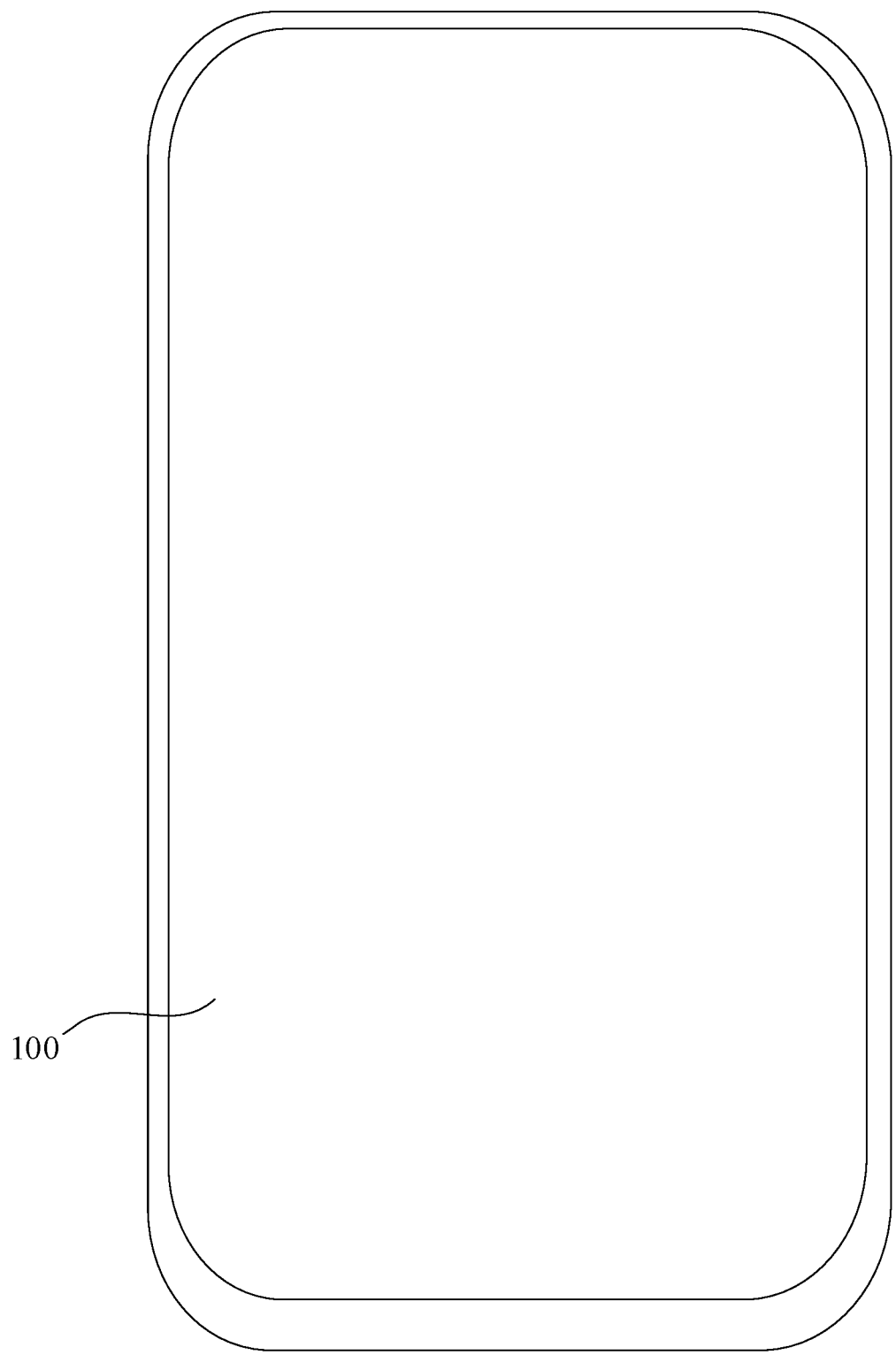
FIG. 16 is a schematic diagram of a structure of a display device according to an embodiment of the present disclosure.

FIG. 16 is a schematic diagram of a structure of a display device according to an embodiment of the present disclosure. In another aspect, as shown in FIG. 16, an embodiment of the present disclosure further provides a display device including the display panel 100 described above.

A structure and principle of the display panel 100 are the same as those in the above embodiments, and will not be repeated herein. The display device may be any electronic device having a display function, such as a touch display screen, a mobile phone, a tablet computer, a notebook computer, or a television.

For the display device in this embodiment of the present disclosure, the light sense signal obtaining unit generates a first light sense voltage value $V_{out1}$ under driving of the first power voltage value V1, and generates a second light sense voltage value $V_{out2}$ under driving of the second power voltage value V2. By subtracting the second light sense voltage value $V_{out2}$ from the first light sense voltage value $V_{out1}$ by the subtracted 2, the common mode interference thereof can be eliminated to obtain the light sense data value without the common mode interference. Fingerprint recognition can be performed based on the light sense data value, which reduces an adverse effect of the common mode interference on an output of the fingerprint recognition circuit, thereby increasing accuracy of fingerprint recognition.

The above-described embodiments are merely preferred embodiments of the present disclosure and are not intended to limit the present disclosure. Any modifications, equivalent substitutions and improvements made within the principle of the present disclosure shall fall into the protection scope of the present disclosure.

Finally, it should be noted that, the above-described embodiments are merely for illustrating the present disclosure but not intended to provide any limitation. Although the present disclosure has been described in detail with reference to the above-described embodiments, it should be understood by those skilled in the art that it is possible to modify the technical solutions described in the above embodiments or to equivalently replace some or all of the technical features therein, such that these modifications or replacements do not cause the essence of corresponding technical solutions to depart from the scope of the present disclosure.

What is claimed is:

1. A display panel, comprising a plurality of fingerprint recognition circuits, wherein at least one of the plurality of fingerprint recognition circuits comprises a light sense signal obtaining unit and a subtracter,
   wherein the light sense signal obtaining unit is configured to obtain a first light sense voltage value and a second light sense voltage value, the first light sense voltage value is related to a first power voltage value, the second light sense voltage value is related to a second power voltage value, and the first power voltage value is greater than the second power voltage value, and
   wherein the subtracted is configured to subtract the second light sense voltage value from the first light sense voltage value to obtain a light sense data value.

2. The display panel according to claim 1, wherein the light sense signal obtaining unit comprises: a first light sense module and a second light sense module;
   wherein the first light sense module comprises: a power terminal electrically connected to a first power voltage terminal configured to provide the first power voltage value, and a light sense output terminal electrically connected to a first light sense output terminal configured to output the first light sense voltage value; and
   wherein the second light sense module comprises: a power terminal electrically connected to a second power voltage terminal configured to provide the second power voltage value, and a light sense output terminal electrically connected to a second light sense output terminal configured to output the second light sense voltage value.

3. The display panel according to claim 2, wherein each of the first light sense module and the second light sense module comprises:
   a first transistor comprising a first terminal electrically connected to a reset voltage terminal, a second terminal electrically connected to a light sense change node, and a control terminal electrically connected to a reset terminal;
   a second transistor comprising a first terminal electrically connected to the power terminal, a control terminal electrically connected to the light sense change node, and a second terminal;
   a third transistor comprising a first terminal electrically connected to the second terminal of the second transistor, a second terminal electrically connected to the light sense output terminal, and a control terminal electrically connected to a reading control terminal;
   a photodiode comprising a first terminal electrically connected to the light sense change node, and a second terminal electrically connected to a reference voltage terminal; and
   a capacitor comprising a first terminal electrically connected to the light sense change node, and a second terminal electrically connected to the reference voltage terminal.

4. The display panel according to claim 1, wherein
the light sense signal obtaining unit comprises a light sense module,
wherein the light sense module operates in a plurality of fingerprint recognition cycles, and each of the plurality of fingerprint recognition cycles comprises a first phase and a second phase,
wherein, during the first phase, a power terminal of the light sense module provides the first power voltage value, and a light sense output terminal of the light sense module outputs the first light sense voltage value; and
wherein, during the second phase, the power terminal of the light sense module provides the second power voltage value, and the light sense output terminal of the light sense module outputs the second light sense voltage value.

5. The display panel according to claim 4, wherein the light sense module comprises:
a first transistor comprising a first terminal electrically connected to a reset voltage terminal, a second terminal electrically connected to a light sense change node, and a control terminal electrically connected to a reset terminal;
a second transistor comprising a first terminal electrically connected to the power terminal, a control terminal electrically connected to the light sense change node, and a second terminal;
a third transistor comprising a first terminal electrically connected to the second terminal of the second transistor, a second terminal electrically connected to the light sense output terminal, and a control terminal electrically connected to a reading control terminal;
a photodiode comprising a first terminal electrically connected to the light sense change node and a second terminal electrically connected to a reference voltage terminal; and
a capacitor comprising a first terminal electrically connected to the light sense change node and a second terminal electrically connected to the reference voltage terminal.

6. The display panel according to claim 5, wherein the light sense module further comprises a gating module electrically connected to a first power voltage terminal, a second power voltage terminal, and the power terminal;
wherein the first power voltage terminal is configured to provide the first power voltage value, and the second power voltage terminal is configured to provide the second power voltage value;
wherein, during the first phase, the gating module allows the first power voltage terminal to be electrically connected to the power terminal; and
wherein, during the second phase, the gating module allows the second power voltage terminal to be electrically connected to the power terminal.

7. The display panel according to claim 6, wherein the gating module comprises:
a fourth transistor comprising a first terminal electrically connected to the first power voltage terminal, and a second terminal electrically connected to the power terminal; and
a fifth transistor comprising a first terminal electrically connected to the second power voltage terminal, and a second terminal electrically connected to the power terminal,
wherein, during the first phase, the fourth transistor is turned on, the fifth transistor is turned off, and the first power voltage value provided by the first power voltage terminal is transmitted to the power terminal through the fourth transistor, and
wherein, during the second phase, the fifth transistor is turned on, the fourth transistor is turned off, and the second power voltage value provided by the second power voltage terminal is transmitted to the power terminal through the fifth transistor.

8. The display panel according to claim 1, wherein the first power voltage value is V1 and the second power voltage value is V2, where V1>0 and V2>0.

9. The display panel according to claim 8, wherein V1>2*V2.

10. The display panel according to claim 1, wherein the first power voltage value is V1 and the second power voltage value is V2, where V1>0 and V2<0.

11. The display panel according to claim 10, wherein V1=−V2.

12. The display panel according to claim 3, the display panel further comprising a plurality of pixels,
wherein the photodiode of the first light sense module is a first photodiode, and the photodiode in the second light sense module is a second photodiode, and
wherein the first photodiode and the second photodiode in a same fingerprint recognition circuit are located in an area defined by a same pixel of the plurality of pixels.

13. The display panel according to claim 12, wherein each of the plurality of pixels comprises a plurality of sub-pixels; and
wherein the first photodiode and the second photodiode in the same fingerprint recognition circuit are located in an area defined by a same sub-pixel of the plurality of sub-pixels of one of the plurality of pixels.

14. The display panel according to claim 12, wherein each of the plurality of pixels comprises a plurality of sub-pixels; and
wherein the first photodiode and the second photodiode in a same fingerprint recognition circuit are located at a junction between two adjacent sub-pixels of the plurality of sub-pixels of one of the plurality of pixels.

15. The display panel according to claim 1, wherein the light sense signal obtaining unit is located in a display area, and the subtracted is located in a non-display area.

16. The display panel according to claim 15, the display panel further comprising a flexible circuit board located in the non-display area, wherein the subtracted is located on the flexible circuit board.

17. The display panel according to claim 15, further comprising a driving chip located in the non-display area, wherein the subtracted is integrated in the driving chip.

18. A display device, comprising a display panel, the display panel comprising a plurality of fingerprint recognition circuits, at least one of the plurality of fingerprint recognition circuits comprising a light sense signal obtaining unit and a subtracted,
wherein the light sense signal obtaining unit is configured to obtain a first light sense voltage value and a second light sense voltage value, the first light sense voltage value is related to a first power voltage value, the second light sense voltage value is related to a second power voltage value, and the first power voltage value is greater than the second power voltage value, and
wherein the subtracted is configured to subtract the second light sense voltage value from the first light sense voltage value to obtain a light sense data value.

* * * * *

UNITED STATES PATENT AND TRADEMARK OFFICE
CERTIFICATE OF CORRECTION

PATENT NO. : 11,270,093 B2
APPLICATION NO. : 16/790314
DATED : March 8, 2022
INVENTOR(S) : M. Lai et al.

It is certified that error appears in the above-identified patent and that said Letters Patent is hereby corrected as shown below:

On the Title Page

| Column | Line | |
|---|---|---|
| item (57) | 5 | change "subtracted" to -- subtracter --. |
| item (57) | 12 | change "subtracted" to -- subtracter --. |

In the Claims

| Column | Line | |
|---|---|---|
| 12 | 24 | change "subtracted" to -- subtracter --. |
| 14 | 43 | change "subtracted" to -- subtracter --. |
| 14 | 46 | change "subtracted" to -- subtracter --. |
| 14 | 51 | change "subtracted" to -- subtracter --. |
| 14 | 55 | change "subtracted" to -- subtracter --. |
| 14 | 63 | change "subtracted" to -- subtracter --. |

Signed and Sealed this
Sixth Day of June, 2023

Katherine Kelly Vidal
*Director of the United States Patent and Trademark Office*